United States Patent
Lin et al.

(10) Patent No.: US 9,601,879 B1
(45) Date of Patent: Mar. 21, 2017

(54) METHODS FOR DETECTING LOOSE CONNECTION IN POWER CONNECTORS

(71) Applicant: GM GLOBAL TECHNOLOGY OPERATIONS LLC, Detroit, MI (US)

(72) Inventors: Wen-Chiao Lin, Rochester Hills, MI (US); Xinyu Du, Oakland Township, MI (US); Youssef A. Ghoneim, Rochester, MI (US); Daniel Demitrish, Warren, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 15/057,154

(22) Filed: Mar. 1, 2016

(51) Int. Cl.
| | |
|---|---|
| *G08B 21/00* | (2006.01) |
| *H01R 13/66* | (2006.01) |
| *H01R 31/08* | (2006.01) |
| *G01R 31/00* | (2006.01) |
| *G01R 31/04* | (2006.01) |
| *G08B 21/18* | (2006.01) |

(52) U.S. Cl.
CPC ....... *H01R 13/6683* (2013.01); *G01R 31/005* (2013.01); *G01R 31/043* (2013.01); *G08B 21/182* (2013.01); *H01R 31/08* (2013.01)

(58) Field of Classification Search
CPC .............................. G01R 31/02; H01R 13/665
USPC .................. 340/662, 531, 657; 439/119, 135
See application file for complete search history.

(56) References Cited

U.S. PATENT DOCUMENTS

| | | | |
|---|---|---|---|
| 4,934,955 A * | 6/1990 | Taylor | H01R 13/629 439/135 |
| 6,848,948 B1 * | 2/2005 | Khemakhem | H01P 1/045 439/668 |
| 9,337,582 B2 * | 5/2016 | Sato | H01R 13/6456 |
| 2005/0136723 A1 * | 6/2005 | Dilliner | H01R 24/28 439/320 |

* cited by examiner

*Primary Examiner* — Phung Nguyen
(74) *Attorney, Agent, or Firm* — Quinn Law Group

(57) ABSTRACT

An electrical connector assembly that includes a female and male connector assembly. The female assembly includes a primary female housing including two female terminals. A secondary female housing including two female terminals short circuited to one another. The secondary female housing affixed to a side of the primary female housing. A male connector assembly including a primary male housing including two male terminals. The two male terminals in contact with the two female terminals of the primary female housing when the primary male housing is seated in the primary female housing for providing electrical energy to the electrical component. A secondary male housing including two male terminals. The secondary male housing affixed to a side of the primary male housing, wherein at least one of the two male terminals have a shorter length than the at least two male terminals of the primary male housing.

22 Claims, 5 Drawing Sheets

METHODS FOR DETECTING LOOSE CONNECTION IN POWER CONNECTORS

BACKGROUND OF INVENTION

An embodiment relates to power connectors, and more specifically, detection of loose power connectors.

Power connectors provide a physical connection between two electrical devices such as electrical conduit and an electrically powered component. Various systems, such as vehicles, aircraft, marine vessels, building wiring, computers, electronics, robots, etc., often include many wires, connectors, terminals, electrical harnesses that provide an electrical signal path for various systems, sub-systems, controllers, sensors, actuators, etc. For example, the electrical systems in a vehicle typically include a number of multi-terminal connectors that simultaneously connect a number of wires. The physical connection utilizes a first connector coupled to a second connector. A first respective connector will utilize at least one male terminal and the second connector will utilize at least one female terminal. In an exemplary multi-connector design, wires are electrically connected using gender specific male and female terminals. The male terminals are inserted into the female terminals when the terminal housings are joined to make the electrical connections between the wires. Various types of connections may be utilized including a spring type clip, which provides tension to between the mating terminals to assure electrical contact. Another type of connection may include the connector housing utilizing a locking feature to secure terminal-to-terminal contact via the connector housings.

The male terminals are inserted into the female terminals to make an electrical connection and transfer electrical energy from the electrical conduit to the electrically powered component. While these components utilize either a press-in connection or a locking tab connection, vibrations during operation (e.g., vehicle traveling down a bumpy road) may cause a loose connection. In certain systems such as steering systems, detection of a loose connection is important to identify before the electrical connection disconnects and power to the electrical component is lost. Various tools and techniques are known in the art to detect and localize the electrical disconnection of a vehicle connector; however, all of these known techniques are only able to determine when the electrical connection between the two terminals is lost, not when the electrical connection is starting to loosen or prior to the article connection being fully disconnected.

SUMMARY OF INVENTION

An advantage of an embodiment is a detection of a loose power connection between a male connector and a female connector prior to the power connection becoming electrically disconnected. The male connector and the female connector each include primary housing for transferring power from a power source to an electrical component. The male connector and the female connector each include a secondary housing for detecting whether the connection between the primary housings are loose. A male secondary housing includes male terminals that are shorter in length than the male terminals of the primary housings. That is, the overlapping contact surfaces between the mating male and female terminals of the secondary housing is shorter than the overlapping contact surfaces between the male and female terminals of the primary housing which allows the secondary male terminals to fully disconnect before the primary male terminals disconnect. Successful disconnection of the secondary terminals before while the primary terminals maintain connection requires proper positioned and aligned. As a result, if the power connection of the primary connection loosens and backs off, the short length terminals of the secondary housing will disconnect while the connection between terminals of the primary housing while loose are still connected, thereby enabling a warning to be provided to the driver of the vehicle before the power connection is entirely disconnected.

A detection circuit is utilized to detect an open circuit condition between the secondary housings. One exemplary circuit includes the female terminals of the secondary housing short circuited together by design. Therefore, if the respective terminals of the secondary housings become disconnected an open circuit is detected. As a result, the detection circuit measures a 0V on a voltage diagnostic sense line when the secondary housings are fully connected and pull-up voltage of 12V is measured on the voltage sense line when the secondary housings are disconnected.

The secondary housings may be positioned on any side of primary housings for which packaging allows. In addition, since the secondary housing is a separate housing from the primary housing, the current draw and electrical loads placed on the terminals of the secondary housing can be lower and therefore cost may be reduced.

An embodiment contemplates an electrical connector assembly comprises a female connector assembly that includes a primary female housing including at least two female terminals. The at least two terminals are in electrical connection with a power source. A secondary female housing includes two female terminals short circuited to one another. The secondary female housing is affixed to a respective side of the primary female housing. A male connector assembly includes a primary male housing including at least two male terminals. The at least two terminals are in electrical connection with an electrical component. The at least two male terminals are in contact with the two female terminals of the primary female housing when the primary male housing is seated in the primary female housing for providing electrical energy to the electrical component. A secondary male housing includes two male terminals. The secondary male housing is affixed to a respective side of the primary male housing. At least one of the two male terminals has a shorter length than the at least two male terminals of the primary male housing.

An embodiment contemplates a method of detecting a loose power connection. A female connector assembly is provided that includes a primary female housing and a secondary female housing. The primary female housing includes at least two female terminals. The at least two female terminals are in electrical connection with a power source. The secondary female housing includes two female terminals short circuited to one another. The secondary female housing is affixed to a respective side of the primary female housing. A male connector assembly is provided that includes a primary male housing and a secondary male housing. The primary male housing includes at least two male terminals. The at least two male terminals being in electrical connection with an electrical component. The at least two male terminals are in contact with the two female terminals of the primary female housing when the primary male housing is seated in the primary female housing for providing electrical energy to the electrical component. The secondary male housing includes two male terminals. The secondary male housing is affixed to the primary male housing on a respective side of the primary male housing. At least one of the two male terminals has a shorter length than the at least two male terminals of the primary male housing. A connection between the male terminals of the secondary male housing and the female terminals of the secondary female housing generates a first voltage on a voltage diagnostic sense line representing a connector intact condition. A disconnection between at least one terminal of the secondary male housing from at least one of the associated terminals of the secondary female housing generates a second voltage on the voltage diagnostic sense line representing a loose connector condition. The second voltage being greater than the first voltage. An ignition on condition is identified. A diagnostic voltage is measured on a voltage diagnostic sense line over a duration of time. A determination is made whether the measured diagnostic voltage is greater than a voltage threshold. A warning signal is generated to a driver in response to the measured diagnostic voltage being greater than the voltage threshold. An embodiment contemplates a method of detecting a loose power connection. A female connector assembly is provided that includes a primary female housing and a secondary female housing. The primary female housing includes at least two female terminals. The at least two female terminals are in electrical connection with a power source. The secondary female housing includes two female terminals short circuited to one another. The secondary female housing is affixed to a respective side of the primary female housing. A male connector assembly is provided that includes a primary male housing and a secondary male housing. The primary male housing includes at least two male terminals. The at least two male terminals being in electrical connection with an electrical component. The at least two male terminals are in contact with the two female terminals of the primary female housing when the primary male housing is seated in the primary female housing for providing electrical energy to the electrical component. The secondary male housing includes two male terminals. The secondary male housing is affixed to the primary male housing on a respective side of the primary male housing. At least one of the two male terminals has a shorter length than the at least two male terminals of the primary male housing. A connection between the male terminals of the secondary male housing and the female terminals of the secondary female housing generates a first voltage on a voltage diagnostic sense line representing a connector intact condition. A disconnection between at least one terminal of the secondary male housing from at least one of the associated terminals of the secondary female housing generates a second voltage on the voltage diagnostic sense line representing a loose connector condition. The second voltage being greater than the first voltage. During an ignition on cycle, measuring diagnostic voltages after each predetermined period of time. Incrementing an intact connector condition count each time the measured diagnostic voltage is less than the voltage threshold. Incrementing a loose connector condition count each time the measured diagnostic voltage is less than the voltage threshold.

DETAILED DESCRIPTION

Figure 1:
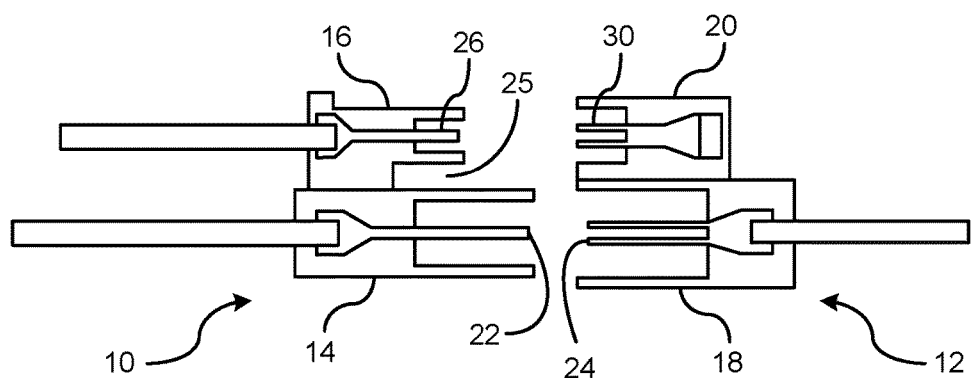
FIG. 1 illustrates a side cross section view of male and female terminal housings.

The following detailed description is meant to be illustrative in understanding the subject matter of the embodiments and is not intended to limit the embodiments of the subject matter or the application and the uses of such embodiments. Any use of the word "exemplary" is intended to be interpreted as "serving as an example, instance, or illustration." Implementations set forth herein are exemplary are not meant to be construed as preferred or advantageous over other implementations. The descriptions herein are not meant to be bound by any expressed or implied theory presented in the preceding background, detailed description or descriptions, brief summary or the following detailed description.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. It should be appreciated that the various block components shown in the figures may be realized by any number of hardware, software, and/or firmware components configured to perform the specified functions. For example, an embodiment of a system or a component may employ various integrated circuit components, (e.g., memory elements, digital signal processing elements, logic elements, look-up tables, or the like, which may carry out a variety of functions under the control of one or more microprocessors or other control devices).

When implemented in software, various elements of the systems described herein are essentially the code segments or computer-executable instructions that perform the various tasks. In certain embodiments, the program or code segments are stored in a tangible processor-readable medium, which may include any medium that can store or transfer information. Examples of a non-transitory and processor-readable medium include an electronic circuit, a microcontroller, an application-specific integrated circuit (ASIC), a semiconductor memory device, a ROM, a flash memory, an erasable ROM (EROM), a floppy diskette, a CD-ROM, an optical disk, a hard disk, or the like.

The system and methodology described herein can be utilized to identify loose power connections. While the approach and methodology are described below with respect to vehicle applications, one of ordinary skill in the art appreciates that an automotive application is merely exemplary, and that the concepts disclosed herein may also be applied to any other suitable communications system such as, for example, general industrial automation applications, manufacturing and assembly applications, and gaming.

The term "vehicle" as described herein can be construed broadly to include not only a passenger automobile, but any other vehicle including, but not limited to, rail systems, planes, off-road sport vehicles, robotic vehicles, motorcycles, trucks, sports utility vehicles (SUVs), recreational vehicles (RVs), marine vessels, aircraft, farming vehicles, and construction vehicles.

FIG. 1 illustrates an electrical connection utilizing a male connector 10 in the female connector 12. The male connector 10 includes a primary male housing 14 and a secondary male housing 16. The female connector 12 includes a primary female housing 18 and a secondary female housing 20.

The primary male housing 14 includes at least two male terminals 22 of a same length. The male terminals 22 may include, but is not limited to, a flat blade-type terminal, round/post-type terminal, or a banana-type terminal.

Figure 2:
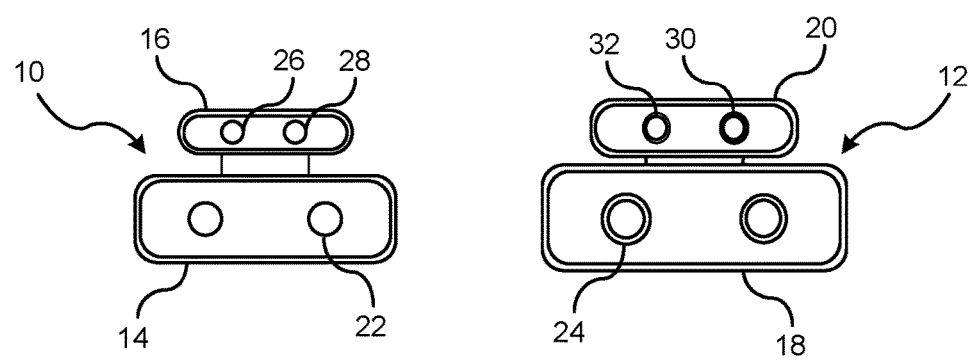
FIG. 2 illustrates front views of the male and female terminal housings

The primary female housing 18 includes at least two electrical female terminals 24. The female terminals 24 are shaped and configured to receive the male terminals 22. When the male terminals 22 are received in the female terminals 24 and an electrical connection is made, power may be transferred from the electrical conduit providing the electrical energy to an electrical component receiving the logical energy. A partial space 25 is formed between the primary male housing 14 and the secondary male housing 16 that allows housing walls of the primary and female housings 18 and 20 to be seated over the primary and secondary male housings 14 and 16. It should be understood that the above configuration as shown is exemplary and other connector configurations, positions, and alignments may be used. FIG. 2 is a front view of the male connector 10 and the female connector 12 illustrating the male terminals 22 and the female terminals 24 as well as the male terminals 26 and 28 and female terminals 30 and 32.

Figure 3:
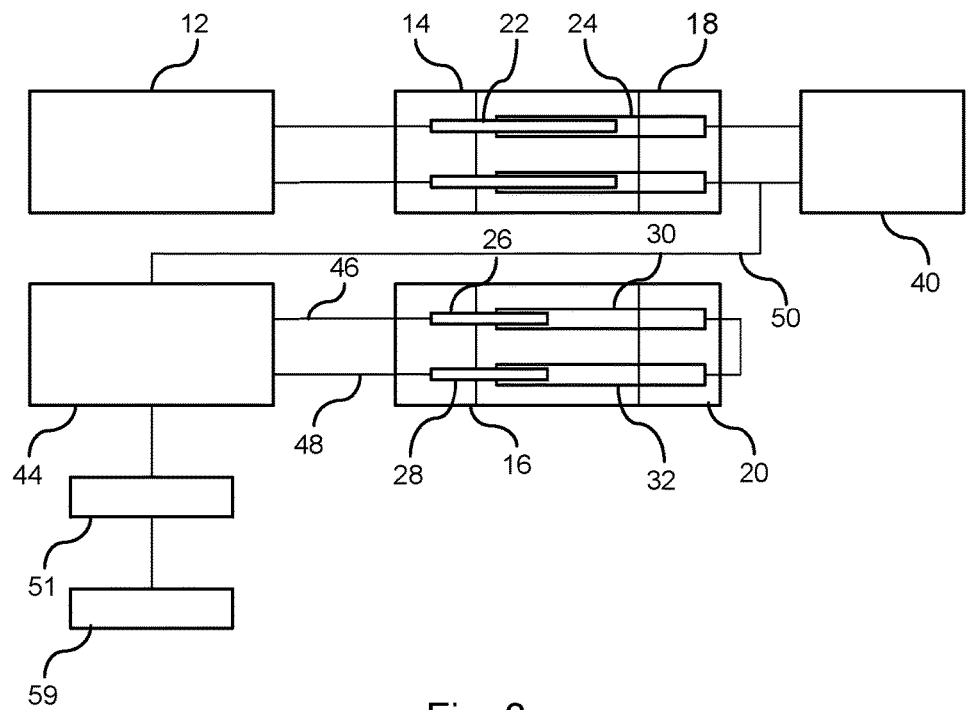
FIG. 3 illustrates an electrical schematic of the electrical supply and detection system.

Referring FIGS. 1-3, the secondary male housing 16 is affixed to a respective side of the primary male housing 14. Preferably, the secondary male housing 16 is affixed to a topside of the primary male housing 14; however, it should be understood that the secondary male housing 16 may be affixed to any side of the primary male housing 14 where packaging space is available. It should also be understood that the secondary male housing 16 can be integral as part of the primary male housing 14 or can be secured to the primary male housing 14 by any technique so long as the secondary male housing 16 remains secured at a same location on the primary male housing 14.

The secondary male housing 16 includes a first male terminal 26 and a second male terminal 28. As described earlier, the first male terminal 26 and second male term 28 may include any configuration or shape; however, a length of either the first male terminal 26 or the second male terminal 28 is shorter in comparison to the plurality of male terminals 22 of the primary male housing 14. Alternatively, both the first male terminal 26 and the second male terminal 28 may be shorter in comparison to the plurality of male terminals 22 of the primary male housing 14.

The secondary female housing 20 is affixed to a respective side of the primary female housing 18. Preferably, the secondary female housing 20 is affixed to a topside of the primary female housing 18; however, it should be understood that the secondary female housing 20 may be affixed to any side of the primary female housing 18 were packaging space is available. It should also be understood that the secondary female housing 20 can be integral as part of the primary female housing 18 or can be secured to the primary female housing 18 by any technique so long as the secondary female housing 20 remains secured at a same location on the primary female housing 18.

The secondary female housing 20 includes a first female terminal 30 and a second female terminal 32. The first female terminal 30 and second female terminal 32 are shorted circuited together. As described earlier, the first female terminal 30 and second female terminal 32 include a configuration or shape that is adapted to receive the first male terminal 26 and second male terminal 28 of the secondary male housing 16.

The first male terminal 26 and second male terminal 28 function as diagnostic terminals in cooperation with the first female terminal 30 and second female terminal 32 for determining when the connection between the primary male housing 14 and the primary female housing 18 are loose but not disconnected. Since first male terminal 26 and/or second male terminal 28 are significantly shorter than the other male terminals of the primary male housing 14, which results in a shorter overlapping contact surfaces with the female terminals of the secondary female housing in comparison to the primary terminals overlapping contact surfaces, the male terminals of the secondary male housing 16 will disengage from female terminals of the secondary female housing 20 before the plurality of terminals 22 of the primary male housing 14 disengage from their associated female terminals 24 thereby providing an indication of a pending failure of the electrical connection between the primary male connector 14 and the primary female connector 18. More specifically, when the each of the housings of the male and female connector are initially secured together, all of the male terminals of both male housings are electrically coupled to their associated female terminals of both female housings. As the connection between the primary male housing 14 and the primary female housing 18 becomes loose, the short first and/or second male terminals 26 and 28 electrically disengage from their associated first and second female terminals 30 and 32 before the male terminals 22 providing electrical energy to drive the electrical component disengage from their associated female terminals 24. This provides a technique to provide early detection that the male terminals 22 are loosening from the female terminals 24 before electrical connection to the particular vehicle component is lost during operation. Various procedures may be used to determine the optimal length of the shortened terminals 26 relative to the terminals 22. One such non-limiting technique may include, but is not limited to, the technique described in application having a Ser. No. 14/685,172 filed Apr. 13, 2015, entitled "Prognosis of Connector Disconnection With Canary-Based Short Terminals" incorporated herein by reference.

In FIG. 3, an electrical schematic is illustrated that detects the electrical connection between the primary male connector 14 and the primary female connector 18. A power supply 40 provides electrical power to the primary female housing 18 which in turn provides power to an electrical component 42 via the terminals of the primary male housing 14.

A detection circuitry 44 detects whether the secondary male housing 16 is disconnected from the secondary female housing 20. The detection circuitry 44 includes a first sense line 46 coupled to the first male terminal 26 of the secondary connector 16, and a second sense line 48 is coupled to second male terminal 28 of the secondary connector 16. A reference pull-up voltage (e.g., 12V) is provided from the power supply 40 and is supplied to the detection circuitry 44 as a pull-up voltage reference.

Figure 4:
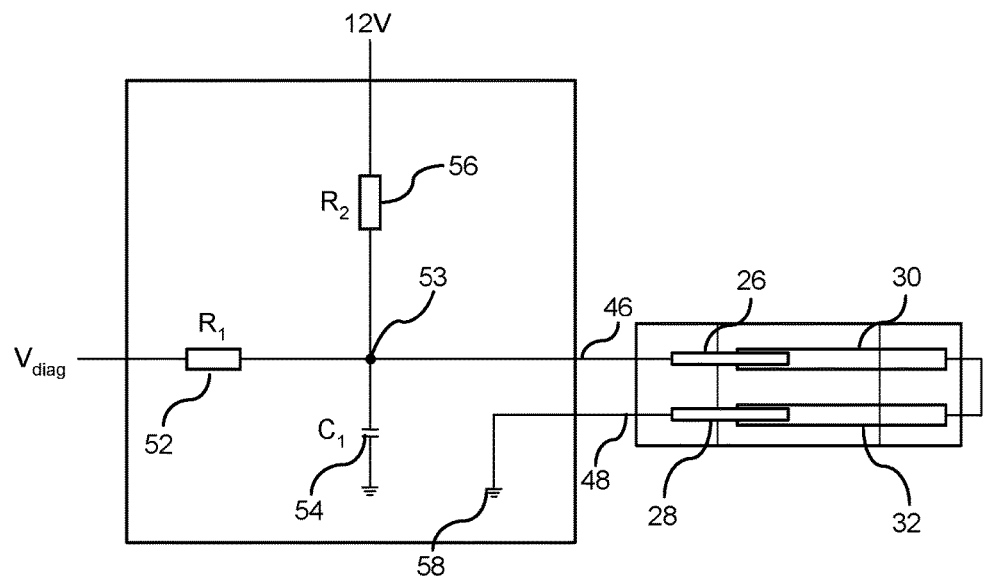
FIG. 4 is a schematic diagram of the detection circuitry for detecting the loose connection

The detection circuitry is shown in greater detail in FIG. 4. The first sense line 46 is coupled to a voltage diagnostic sense line $V_{diag}$. The voltage diagnostic sense line $V_{diag}$ may be coupled to a processor 51 (as shown in FIG. 3) or other device for measuring a 12V condition or a 0V condition on the sense line 46. The voltage diagnostic sense line $V_{diag}$ is coupled to the first male terminal 26 through a node 53. A low pass filter is coupled between the voltage diagnostic sense line $V_{diag}$ and the node 53. The low pass filter includes a resistive element 52 and capacitive element 54. The 12V reference source is also coupled to the node 53 via a resistive element 56. The 12V reference source is coupled in series to the voltage diagnostic sense line $V_{diag}$. The second female terminal 28 is coupled by the second sense line 48 directly to ground 58.

When the primary male housing 14 is securely coupled to the primary female housing 18, the sense line 46 is coupled directly to ground 58 as a result of the connection between the secondary male housing 16 and the secondary female housing 20. As a result, $V_{diag}$ will measure 0V. It should be understood that the short circuit between the first female terminal 30 and the second female terminal 32 may be an external wire or may be an internal connection with the secondary female housing 20.

If the connection between the primary male housing 14 and the primary female housing 18 becomes loose (e.g., the connectors slightly back off from one another), but do not disconnect from one another, the shortened secondary male terminals 26 and 28 will disconnect from secondary female terminals 30 and 32 resulting in an open circuit between the secondary male housing 16 and the secondary female housing 20. The sense line 46 will be in an open circuit condition since the sense line 46 is no longer coupled to ground 58. As a result, the voltage diagnostic sense line $V_{diag}$ will measure the reference voltage (e.g., 12V) supplied by the power supply as a result of the open circuit condition. In response to the voltage pull-up caused by the open circuit condition, the processor 51 or similar will sense this condition on voltage diagnostic sense line $V_{diag}$ and will set a flag that a loose connector condition present. An output device 59 (shown in FIG. 3) generates a warning that may include, but is not limited to, a visual output, audible output, or haptic output. This provides the driver with a warning to service the vehicle immediately.

Figure 5:
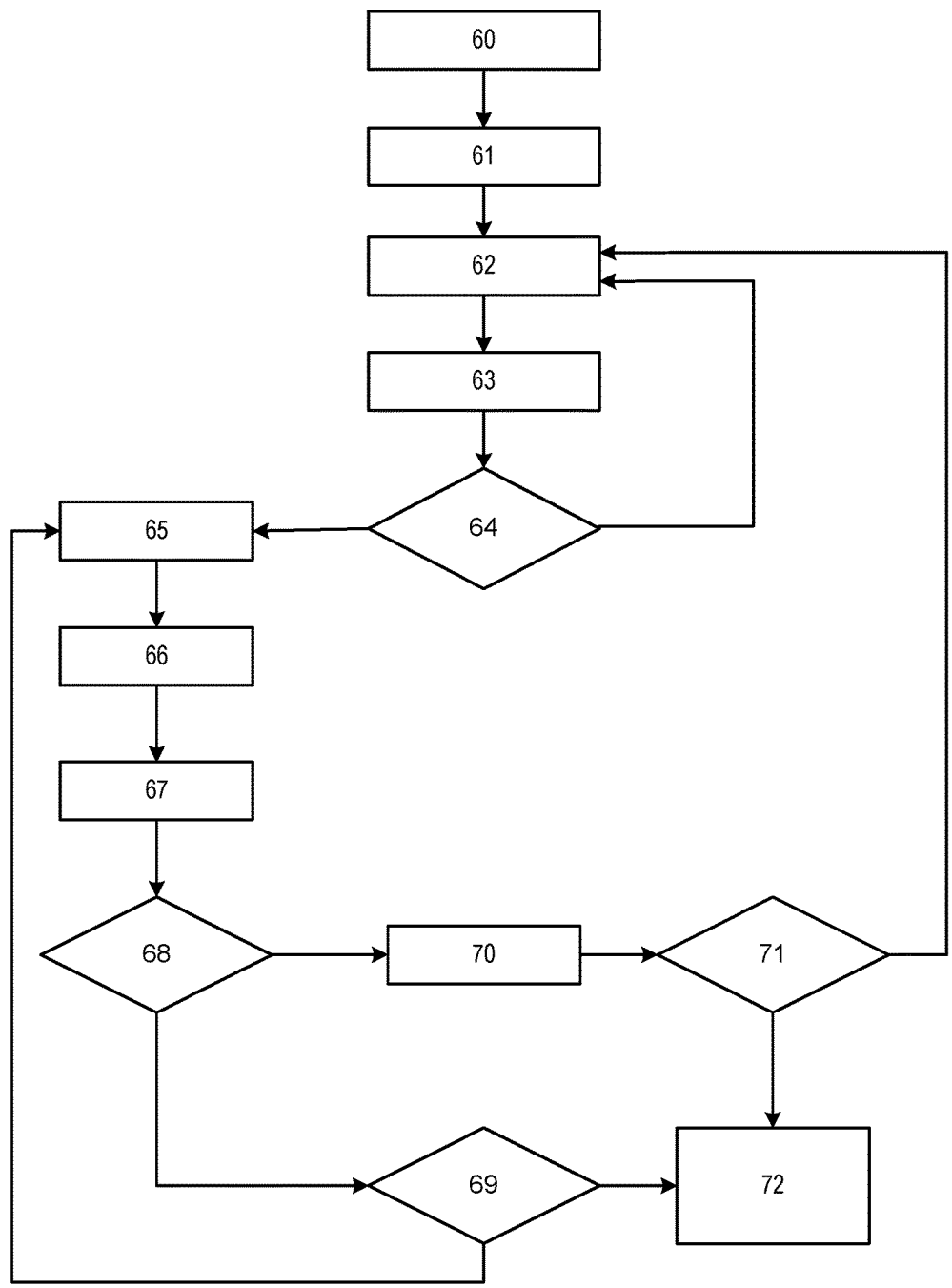
FIG. 5 is a flowchart of a first embodiment for detecting a loose connector.

FIG. 5 illustrates a flowchart of a first method for detecting a loose connection between power connectors. The following technique is performed, analyzed, and detected during the ignition on condition. In step 60, the algorithm is triggered by an ignition on sequence.

In step 61, a count is initially set to zero (e.g., N=0).

In step 62, the process waits for a predetermined period of time to elapse. A respective time period may include, but is not limited to 200 ms.

In step 63, the measurements are obtained from the voltage diagnostic sense line $V_{diag}$ and collected.

In step 64, a determination is made whether the measurement from the voltage diagnostic sense line $V_{diag}$ is greater than a voltage threshold ($T_1$). If the voltage diagnostic measurement $V_{diag}$ is greater than the voltage threshold ($T_1$), then the routine proceeds to step 65, otherwise the routine returns to step 62.

In step 65, a timer is set to t=0 and the timer is started.

In step 66, the routine waits for the predetermined period of time.

In step 67, measurements from the voltage diagnostic sense line $V_{diag}$ are measured and collected.

In step 68, a determination is made as to whether measurements from the voltage diagnostic sense line $V_{diag}$ collected in step 67 are greater than the predetermined voltage threshold ($V_T$). If the determination is made that the measurements from the voltage diagnostic sense line $V_{diag}$ is greater than the predetermined voltage threshold ($V_T$), then the routine proceeds to step 69; otherwise the routine proceeds to step 70.

In step 69, in response to a determination that the next measurements from the voltage diagnostic sense line $V_{diag}$ is greater than the predetermined voltage threshold ($V_T$), a determination is made as to whether the timer is greater than a timer threshold ($t_1$). If the response to the determination that the timer threshold ($t_1$) is not exceeded, then the routine returns to step 66 to wait the predetermined period of time to obtain additional measurements from the voltage diagnostic sense line $V_{diag}$. If the determination is made that the timer is greater than the predetermined timer threshold, then a determination is made that the measurements from the voltage diagnostic sense line $V_{diag}$ has exceeded the voltage threshold for at least the duration of time such that a determination can be made that a loose connection is present. The routine proceeds to step 72.

In step 72, in response to the determination that the timer is greater than the timer threshold ($t_1$), a respective DTC is set to indicate that the power connector is loose. A warning such as a visual warning, audible warning, or haptic warning or a combination is output to the driver.

Referring again to step 69, in response to the determination that the measurements from the voltage diagnostic sense line $V_{diag}$ is not greater than the predetermined voltage threshold ($V_T$), the count (N) is increased by 1. The result of the measurements from the voltage diagnostic sense line $V_{diag}$ not being greater than the predetermined voltage threshold ($V_T$) after already detecting of an instance of the voltage threshold being exceeded may be the result of intermittent loose connections where the connection intermittently disconnects and reconnects. Under such circumstances, a predetermined number of intermittent occurrences throughout an ignition cycle would imply a loose connection. Therefore, the system checks for loose connections that occur intermittently during the course of an ignition cycle.

In step 71, a determination is made as to whether the count is greater than a count threshold (N>$N_0$). If the count (N) does not exceed the count threshold ($N_0$), then a return is made to step 62 where the routine waits for the predetermined period of time to elapse and then obtains additional measurements from the voltage diagnostic sense line $V_{diag}$. If the determination is made that the count (N) does exceed the count threshold ($N_0$), then a determination is made that a respective number of intermittent loose connections have been detected in order to make the determination that a loose connection is present in the power connection. The routine proceeds to step 72 where a warning is provided to the driver of the loose power connection.

Figure 6:
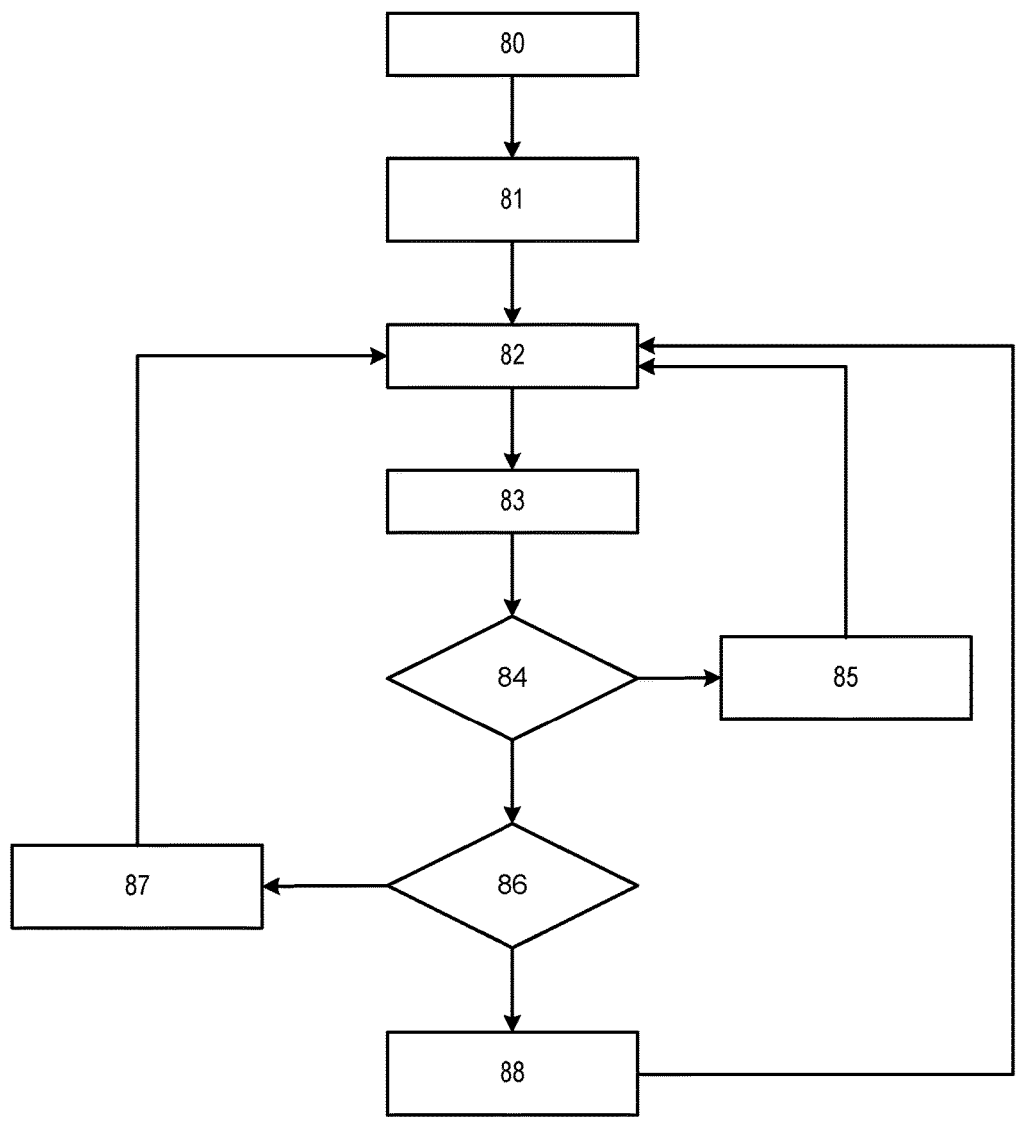
FIG. 6 is a flowchart of a second embodiment for obtaining data relating to the electrical connection.

FIG. 6 illustrates a flowchart of a second method for detecting a loose connection between power connectors. The following technique collects data during an ignition on cycle and determines the loose connection during an ignition off cycle.

In step 80, the algorithm is triggered by an ignition on sequence.

In step 81, the PID count for a normal condition is set to zero $C_0$=0 and the PID count for a pull-up condition is set to zero $C_p$=0. The normal condition is defined as no loose condition referring to a measurements from the voltage diagnostic sense line $V_{diag}$ as 0V, and a pull-up condition where the measurements from the voltage diagnostic sense line $V_{diag}$ is 12V.

In step 82, the process waits for a predetermined period of time to elapse. A respective time period may include, but is not limited to, 200 ms.

In step 83, the measurements from the voltage diagnostic sense line $V_{diag}$ are collected.

In step 84, a determination is made whether a measurement from the voltage diagnostic sense line $V_{diag}$ is greater than a predetermined voltage threshold ($V_T$). If the measurement from the voltage diagnostic sense line $V_{diag}$ is greater than the predetermined voltage threshold ($V_T$), then the routine proceeds to step 85, otherwise the routine returns to step 86.

In step 85, the PID pull-up ($C_p$) count is incremented by 1 ($C_p=C_p+1$). Thereafter, the routine proceeds to step 82.

In step 86, in response to a determination in step 84 that the measurement from the voltage diagnostic sense line $V_{diag}$ is not greater than the predetermined voltage threshold ($V_T$), a determination is made that whether the PID for the pull-up count is equal to zero (Cp=0). If the PID for the pull-up count is equal to zero (Cp=0), then the routine proceeds to step 87; otherwise the routine proceeds to step 88.

In step 87, the PID count for the normal condition is set to zero ($C_0=0$) and the routine returns to step 82 to wait the predetermined period of time and then obtain measurements from the voltage diagnostic sense line $V_{diag}$.

Referring again to step 86, if the determination is made that the PID for the pull-up count is not equal to zero, then the routine proceeds to step 88 where the PID for the normal count is incremented by one ($C_0=C_0+1$) Thereafter the routine returns to step 82 to wait the predetermined period of time and then obtain measurements from the voltage diagnostic sense line $V_{diag}$.

The above routine will continuously operate until an engine off operation is executed.

Figure 7:
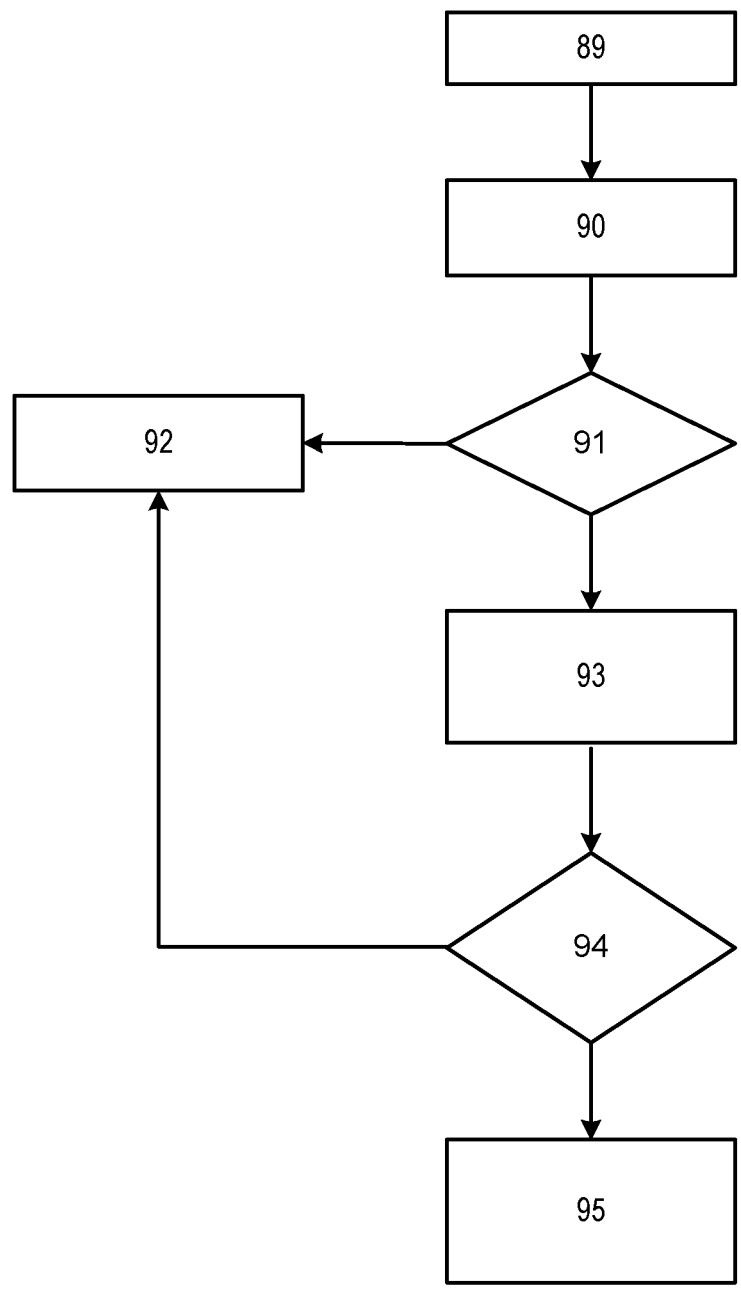
FIG. 7 is a flowchart of the second embodiment of detecting the loose connection using the data obtained by the process in FIG. 6.

FIG. 7 illustrates the determination of a loosed power connector in response to the engine off operation.

In step 89, an ignition off cycle is detected, and measurements from the voltage diagnostic sense line $V_{diag}$ are terminated.

In step 90, each of the PIDS collected for the normal count ($C_0$) and pull-up count ($C_p$) are collected.

In step 91, a determination is made as to whether the PID for the pull-up count is equal to zero (Cp=0). If the determination is made that the PID for the pull-up count is equal to zero (Cp=0), then the routine advances to step 92; otherwise, the routine proceeds to step 93.

In step 92, a determination is made that the power connection is connected and the routine terminates.

In step 93, in response to the determination that the pull-up count is not equal to zero (Cp=0), a pull-up ratio is determined. The pull-up ratio determines a ratio of the determined number of pull-ups relative to the total number out counts determined for both the normal count and pull-up count. The pull-up ratio is determined by the following formula:

$$\frac{C_p}{C_p+C_0}.$$

In step 94, a determination is made as to whether the pull-up ratio is greater than the predetermined ratio threshold ($R_T$). The determination may be represented by the following formula:

$$\frac{C_p}{C_p+C_0} > R_T.$$

If the determination is made that the pull-up ratio is not greater than the predetermined ratio threshold ($R_T$), then a return is made to step 92 where the determination is made that the power connector is connected and the routine is terminated. If the determination is made that the pull-up ratio is greater than the predetermined ratio threshold ($R_T$), then the routine proceeds to step 95.

In step 95, the warning such as a visual warning, audible warning, or haptic warning or a combination is output to the driver via an output device.

While certain embodiments of the present invention have been described in detail, those familiar with the art to which this invention relates will recognize various alternative designs and embodiments for practicing the invention as defined by the following claims.

What is claimed is:

1. An electrical connector assembly comprising:
   a female connector assembly comprising:
      a primary female housing including at least two female terminals, the at least two terminals in electrical connection with a power source;
      a secondary female housing including two female terminals short circuited to one another, the secondary female housing affixed to a respective side of the primary female housing;
   a male connector assembly comprising:
      a primary male housing including at least two male terminals, the at least two terminals in electrical connection with an electrical component, the at least two male terminals in contact with the two female terminals of the primary female housing when the primary male housing is seated in the primary female housing for providing electrical energy to the electrical component;
      a secondary male housing including two male terminals, the secondary male housing affixed to a respective side of the primary male housing, wherein at least one of the two male terminals have a shorter length than the at least two male terminals of the primary male housing.

2. The electrical connector assembly of claim 1 wherein at least one of the two male terminals of the secondary male housing having the shorter length enable the secondary male housing to be electrically disconnected from at least one female terminal of the secondary female housing while the male terminals of the primary male connector are partially withdrawn yet still connected to the female terminals of the primary female housing.

3. The electrical connector assembly of claim 1 wherein the two male terminals of the secondary male housing maintain electrical connection with the two female terminals of the secondary female housing when the primary male housing is fully seated within the primary female housing.

4. The electrical connector assembly of claim 1 further comprising detection circuitry to detect when the at least one of the two terminals of the secondary male housing electrically disconnects from at least one associated female terminal of the secondary female housing.

5. The electrical connector assembly of claim 4 wherein the detection circuitry is integrally formed as part of the secondary male housing.

6. The electrical connector assembly of claim 4 wherein the detection circuitry is disposed separately from the secondary male housing.

7. The electrical connector assembly of claim 4 wherein the detection circuitry comprises:
   a node;

a first sense line coupled between the node and the first male terminal of the secondary male housing;

a low pass filter coupled between the node and a voltage diagnostic sense line;

a second sense line coupled between a second male terminal and a ground;

a resistive element coupled between the node and a reference voltage, the resistive element being in parallel with the low pass filter.

8. The electrical connector assembly of claim 7 wherein an electric connection between the two male terminals of the secondary male housing and the two female terminals of the secondary female housing generates 0 volts on the voltage diagnostic sense line.

9. The electrical connector assembly of claim 8 wherein an electric disconnection between the at least one of the two male terminals of the secondary male housing and an associated female terminal of the secondary female housing generates a 12 volt signal on the voltage diagnostic sense line.

10. The electrical connector assembly of claim 1 wherein the two female terminals of the secondary female housing are short circuited internally within the secondary female housing.

11. The electrical connector assembly of claim 1 wherein the primary male housing and the secondary male housing are integrally formed as a monolithic housing assembly.

12. The electrical connector assembly of claim 1 wherein the primary female housing and the secondary female housing are integrally formed as a monolithic housing assembly.

13. The electrical connector assembly of claim 1 further comprising a partial space formed between the primary male housing and the secondary male housing, the partial space allowing a wall of the primary female housing and a wall of the secondary female housing to seat over a wall of the primary male housing and secondary male housing, respectively.

14. A method of detecting a loose power connection comprising the steps of:

providing a female connector assembly that includes a primary female housing and a secondary female housing, the primary female housing including at least two female terminals, the at least two female terminals being in electrical connection with a power source, the secondary female housing including two female terminals short circuited to one another, the secondary female housing affixed to a respective side of the primary female housing;

providing a male connector assembly that includes a primary male housing and a secondary male housing, wherein the primary male housing includes at least two male terminals, the at least two male terminals being in electrical connection with an electrical component, the at least two male terminals are in contact with the two female terminals of the primary female housing when the primary male housing is seated in the primary female housing for providing electrical energy to the electrical component, wherein the secondary male housing includes two male terminals, the secondary male housing affixed to the primary male housing on a respective side of the primary male housing, at least one of the two male terminals having a shorter length than the at least two male terminals of the primary male housing, wherein a connection between the male terminals of the secondary male housing and the female terminals of the secondary female housing generates a first voltage on a voltage diagnostic sense line representing a connector intact condition, and wherein a disconnection between at least one terminal of the secondary male housing from at least one of the associated terminals of the secondary female housing generates a second voltage on the voltage diagnostic sense line representing a loose connector condition, the second voltage being greater than the first voltage;

identifying an ignition on condition;

measuring a diagnostic voltage on a voltage diagnostic sense line over a duration of time;

determining whether the measured diagnostic voltage is greater than a voltage threshold;

generating a warning signal to a driver in response to the measured diagnostic voltage being greater than the voltage threshold.

15. The method of claim 14 wherein measuring a diagnostic voltage on the voltage diagnostic sense line over a duration of time comprises the following steps:

collecting measured diagnostic voltages on the voltage diagnostic sense line after a first period of time;

determining whether the measured diagnostic voltage is greater than the voltage threshold;

in response to the measured diagnostic voltage being greater than the voltage threshold after the first period of time, measuring the diagnostic voltage after a second period of time.

16. The method of claim 15 wherein in response to determining whether diagnostic voltage is greater than the voltage threshold after the second period of time, a determination is made whether a timer is greater than a timer threshold, and wherein the warning signal is issued in response to the timer being greater than the timer threshold.

17. The method of claim 16 wherein in response determining that the timer is less than the timer threshold, diagnostic voltage measurements are measured for a next period of time, a determination is made in response to whether the diagnostic voltage is greater than the voltage threshold, and a determination is made as to whether the timer is greater than the timer threshold.

18. The method of claim 17 wherein in response to the diagnostic voltage being less than the voltage threshold after the next period of time, a count is increased and a determination is made as to whether the count is greater than a count threshold.

19. The method of claim 18 wherein the warning signal is generated in response to the counter being greater than the counter threshold.

20. The method of claim 18 wherein a next diagnostic voltage is measured after the next predetermined period of time for determining whether diagnostic voltage is greater than the voltage threshold.

21. A method of detecting a loose power connection comprising the steps of:

providing a female connector assembly that includes a primary female housing and a secondary female housing, the primary female housing including at least two female terminals, the at least two female terminals being in electrical connection with a power source, the secondary female housing including two female terminals short circuited to one another, the secondary female housing affixed to a respective side of the primary female housing;

providing a male connector assembly that includes a primary male housing and a secondary male housing, wherein the primary male housing includes at least two male terminals, the at least two male terminals being in electrical connection with an electrical component, the at least two male terminals are in contact with the two female terminals of the primary female housing when the primary male housing is seated in the primary female housing for providing electrical energy to the electrical component, wherein the secondary male housing includes two male terminals, the secondary male housing affixed to the primary male housing on a respective side of the primary male housing, at least one of the two male terminals having a shorter length than the at least two male terminals of the primary male housing, wherein a connection between the male terminals of the secondary male housing and the female terminals of the secondary female housing generates a first voltage on a voltage diagnostic sense line representing a connector intact condition, and wherein a disconnection between at least one terminal of the secondary male housing from at least one of the associated terminals of the secondary female housing generates a second voltage on the voltage diagnostic sense line representing a loose connector condition, the second voltage being greater than the first voltage;

during an ignition on cycle, measuring diagnostic voltages after each predetermined period of time;

incrementing a intact connector condition count each time the measured diagnostic voltage is less than a voltage threshold; and incrementing a loose connector condition count each time the measured diagnostic voltage is less than the voltage threshold.

22. The method of claim 21 further comprising the steps of:

detecting an engine off cycle;

calculating a loose connection ratio as a function of the loose connector condition count and a sum of the loose connector condition count and intact connector condition count;

determining whether the loose connection ratio is greater than a loose connector threshold;

issuing a loose connector warning in response to the ratio being greater than the loose connector threshold.

* * * * *